Oct. 18, 1966 J. F. BLOKKER ETAL 3,280,347
PULSE CIRCUIT EMPLOYING DIFFERENTIAL AMPLIFIER AND TUNNEL DIODES TO PRODUCE VARIABLE WIDTH RECTANGULAR OUTPUT PULSES
Filed Feb. 18, 1964
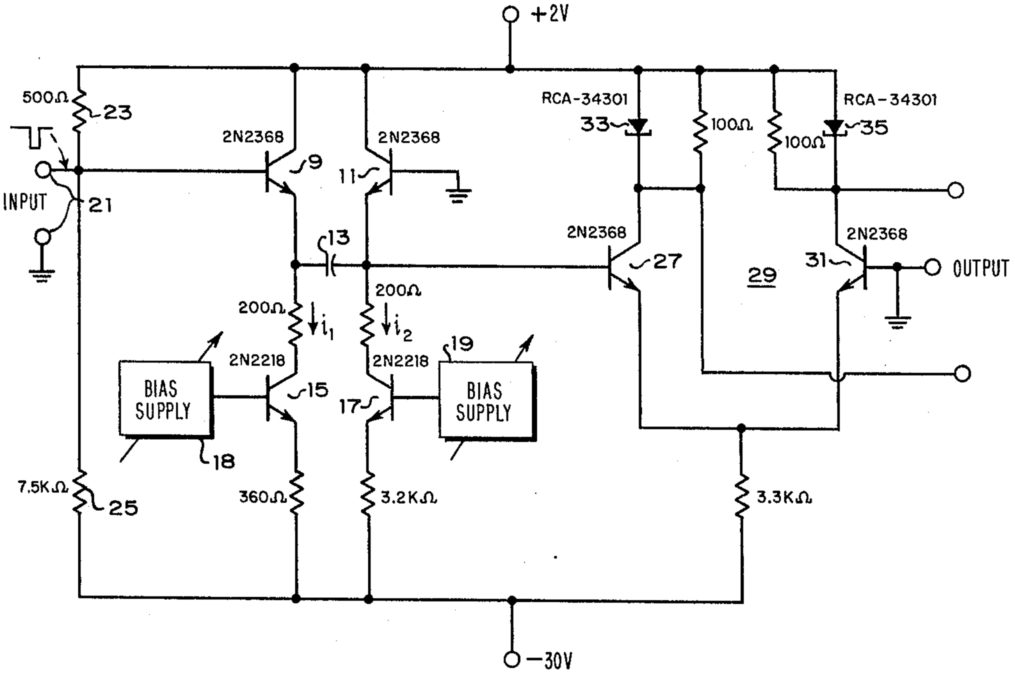
INVENTORS
JOHAN F. BLOKKER
YI H. CO
BY Q. C. Smith
AGENT 3,280,347
Patented Oct. 18, 1966

3,280,347

PULSE CIRCUIT EMPLOYING DIFFERENTIAL AMPLIFIER AND TUNNEL DIODES TO PRODUCE VARIABLE WIDTH RECTANGULAR OUTPUT PULSES

Johan F. Blokker, Palo Alto, and Yi H. Co, Stanford, Calif., assignors to Hewlett-Packard Company, Palo Alto, Calif., a corporation of California Filed Feb. 18, 1964, Ser. No. 345,645
4 Claims. (Cl. 307—88.5)

This invention relates to a circuit which produces output pulses having widely variable pulse width and pulse repetition rate.

It is an object of the present invention to provide a pulse circuit which can operate at repetition rates of the order of 100 megacycles to produce pulses of variable width.

It is another object of the present invention to provide an improved pulse circuit which produces output pulses having a pulse width which is continuously variable over a wide range and which is capable of operating at high duty cycles.

In accordance with the illustrated embodiment of the present invention, a pair of emitter-coupled transistor stages receives trigger pulses at a selected repetition rate. The time during which one of the stages remains in one of its operating states is determined by the amplitudes of emitter currents which are independently adjustable. Two gain elements having tunnel diodes in their load circuits are connected to form a differential amplifier which receives the output of the emitter-coupled stages and produces output pulses having the desired shape and pulse width.

Other and incidental objects of the present invention will be apparent from a reading of this specification and an inspection of the accompanying drawing which shows a schematic diagram of the present invention.

In the drawing, there is shown a pair of transistors 9 and 11 having their emitters connected together through capacitor 13. Independently adjustable emitter currents are supplied through these transistors by the current sources including transistor 15 connected to the emitter of transistor 9 and transistor 17 connected to the emitter of transistor 11. The amplitudes of the currents $i_1$ and $i_2$ are relatively adjustable by varying the settings of the bias supplies 18 and 19 connected to the bases of transistors 15 and 17.

In operation, an input pulse of negative polarity appearing at the input 21 is applied to the base of transistor 9 which is normally biased to conduction by the voltage divider including resistors 23 and 25. This pulse renders transistor 9 non-conductive and permits current to flow through transistor 11 and capacitor 13 to the current source including transistor 15.

Capacitor 13 charges negative on the side connected to transistor 9 until the time transistor 9 is rendered conductive. The positive-going fall time of the input pulse raises the potential of the base and emitter of transistor 9 positively, thus causing the emitter of transistor 11 to rise positively (by capacitive coupling). This cuts off transistor 11 and turns on transistor 27 of the differential amplifier 29. With transistor 11 cut off, capacitor 13 may thus discharge through transistor 9 and the current source including transistor 17. The voltages on the emitters of transistors 11 and 27 vary linearly with time in the negative direction as capacitor 13 discharges. Transistor 11 is again turned on when its base-emitter voltage is sufficient to render it conductive (approximately 600 millivolts for a silicon transistor). At substantially the same time transistor 31 is turned on and transistor 27 is turned off.

The outputs of differential amplifier are taken across the tunnel diodes 33 and 35 connected in the collector circuits of transistors 27 and 31. Thus, as the voltages on the base-emitter junctions of these transistors vary (thus varying the collector currents), the voltages across the tunnel diodes remain relatively unchanged until the collector currents vary above or below the peak or valley current values which switch the diodes. The output (either differentially or single-endedly with respect to ground) of the amplifier 29 is thus a rectangular wave having a repetition rate determined by the input rate of pulses at input 21 and having a duty cycle related to the relative values of the currents $i_1$ and $i_2$ which are determined by the adjustments of bias supplies 18 and 19. The duty cycle (i.e. the ratio of on-time to off-time) may be varied over a wide range to a value as high as 90% at pulse repetition rates as high as 100 megacycles per second in the circuit of the present invention.

We claim:

1. A pulse circuit comprising:
first and second pairs of transistors, each having base, emitter and collector electrodes;
means biasing the transistors of the first pair for providing current flow in the collector electrodes thereof of relatively variable magnitude;
means connecting the collector electrodes of the transistors in said first pair forming current sources to the emitter electrodes of the transistors in the second pair;
a capacitive connection between the emitter electrodes of the transistors in the second pair;
means connected to the base electrodes of the transistors in said second pair for applying a signal to one of the base electrodes with respect to the other of the base electrodes; and
circuit means connected to one of the emitter electrodes of the transistors in the second pair for providing an output therefrom for a period related to the relative magnitudes of the currents in the collector electrodes of the transistors in the first pair.

2. A pulse circuit as in claim 1 wherein:
signal is applied to said one base electrode of the transistors in the second pair and the other base electrode of the transistors in the second pair is connected to a source of reference potential; and
a bias circuit is connected to said one base electrode for normally biasing the transistor in a conduction state.

3. A pulse circuit as in claim 1 wherein:
variable unidirectional signal supplies are connected to the base electrodes of the transistors in the first pair for varying the currents in the collector electrodes thereof.

4. A pulse circuit as in claim 1 wherein:
the circuit means includes a third pair of transistors having base and collector electrodes with one base electrode connected to the emitter electrode of a transistor in the second pair for receiving the signal thereon and having commonly connected emitter electrodes;

a load circuit including a tunnel diode connected to at least one of the collector electrodes of the transistors in the third pair for producing an output signal across the tunnel diode having one of two discrete values in response to the signal applied to said one base electrode of the transistors in the third pair attaining a selected value.

References Cited by the Examiner

UNITED STATES PATENTS

| | | | |
|---|---|---|---|
| 3,144,564 | 8/1964 | Sikorra | 307—88.5 |
| 3,191,071 | 6/1965 | King et al. | 307—88.5 |
| 3,215,854 | 11/1965 | Mayhew | 307—88.5 |

ARTHUR GAUSS, *Primary Examiner.*

J. S. HEYMAN, *Assistant Examiner.*